INVENTORS
JOHN M. GILBERT
MAYNARD D. EAVES
BY A. C. Smith
ATTORNEY

INVENTORS
JOHN M. GILBERT
MAYNARD D. EAVES

BY a. C. Smith

ATTORNEY

United States Patent Office 3,421,211

Patented Jan. 14, 1969

3,421,211

METHOD OF MAKING AND CLEANING PRINTED CIRCUIT ASSEMBLIES

Maynard D. Eaves, Sunnyvale, and John M. Gilbert, Woodside, Calif., assignors to Hewlett-Packard Company, Palo Alto, Calif., a corporation of California Filed Mar. 17, 1966, Ser. No. 535,071

U.S. Cl. 29—626 2 Claims

Int. Cl. H05k 3/30

ABSTRACT OF THE DISCLOSURE

Moist printed circuit boards are driven between resilient rollers and vacuum suction ports to dry them by squeezing and sucking the moisture therefrom. The dried printed circuit boards are mounted on universal racks and loaded with circuit components. These circuit components are then soldered to the printed circuit boards. The soldered printed circuit boards are washed and dried by successively conveying them through a washing chamber where they are sprayed with a cleaning solvent, a blowing chamber where they are blown with a warm gas, and a heating chamber where they are radiantly heated.

This invention relates to methods and apparatus for processing printed circuit boards and has as its principal object the provision of an efficient method and apparatus for drying the boards after the various etching and rinsing operations, handling the boards during the component loading and other subsequent operations, and washing and drying the loaded boards after the soldering operation.

This object is accomplished according to the illustrated embodiment of this invention by providing a method and apparatus for drying the boards by squeezing and sucking moisture from them, a universal rack for supporting the boards, and a method and apparatus for washing and drying the boards by spraying them with a cleaning solvent, blowing them with a warm gas, and radiantly heating them.

Other and incidental objects of this invention will become apparent from a reading of this specification and an inspection of the accompanying drawing in which.

Figure 1:
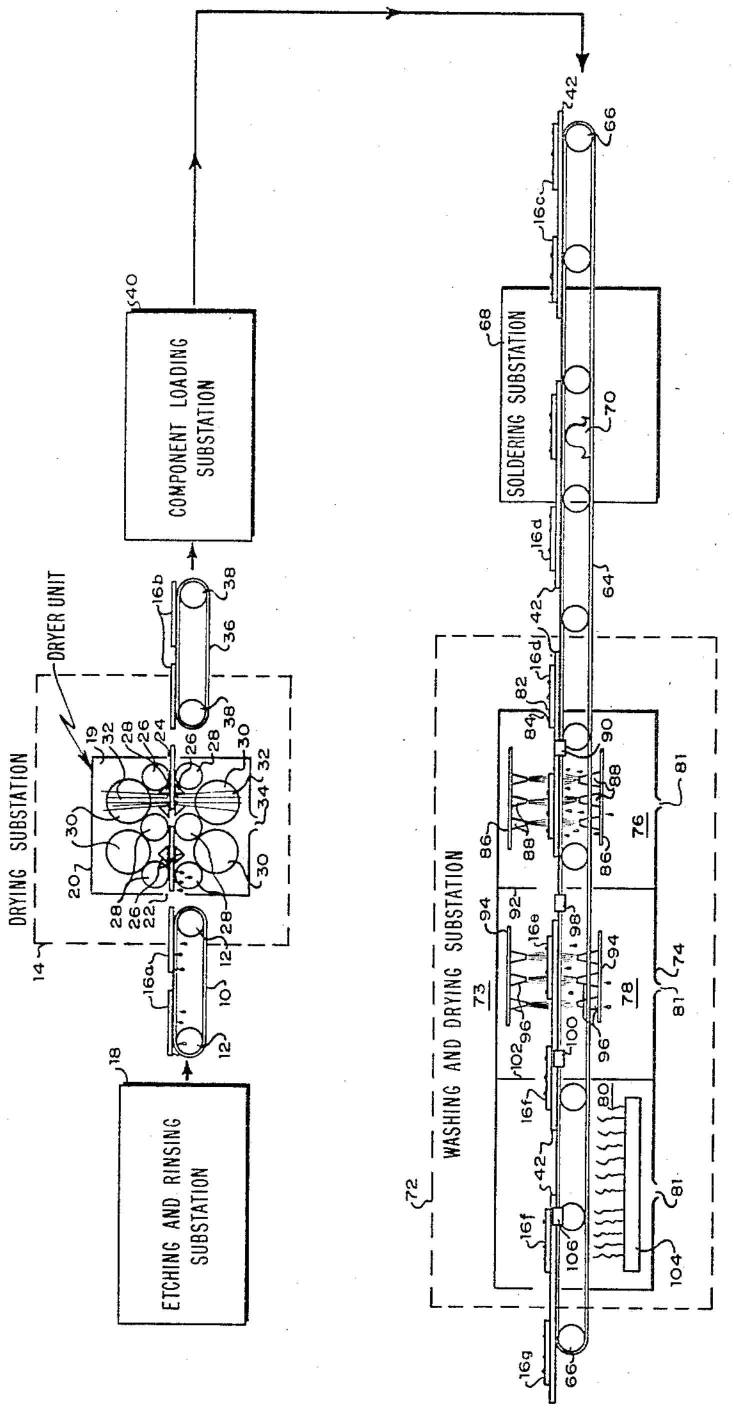
FIGURE 1 is a combined flow diagram and schematic representation of a method and apparatus, respectively, for processing printed circuit boards according to the preferred embodiment of this invention.
Figure 2:
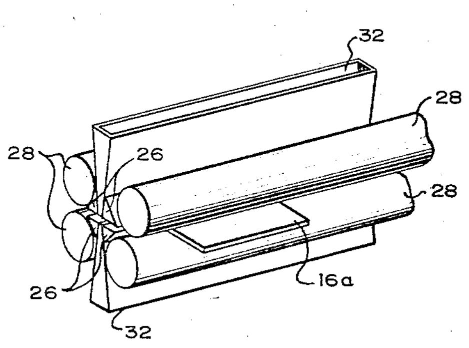
FIGURE 2 is a detailed perspective view of a portion of the drying unit of FIGURE 1.

Referring to FIGURE 1, there is shown a continuous conveyor belt 10 and belt drive 12 for conveying to a drying substation 14 a plurality of printed circuit boards 16*a* which have been moistened during a prior formative operation such as the etching and rinsing operation performed at substation 18. The moist boards 16*a* are dried by performing the operations of squeezing and sucking the moisture from the boards 16*a*. These squeezing and sucking operations may be performed by employing a compact dryer unit 19 such as that shown schematically in FIGURE 1 and partially shown in detail in FIGURE 2. This dryer unit 19 comprises a housing 20 made of a rust-resistant material such as stainless steel and having an input port 22 for receiving the moist boards 16*a* and an output port 24 for dispensing the dried boards 16*b*. Several pairs of spaced guide plates 26 which may be made of nylon are fixedly supported within the housing 20 for guiding the moist boards 16*a* along a fixed guide path between the input and output ports 22 and 24, respectively. Similarly, several pairs of resilient rollers 28 are rotatably mounted within the housing 20 at spaced positions across this guide path. The rollers 28 of each roller pair are mounted on opposite sides of the guide path and are spaced sufficiently close together to engage the top and bottom sides of the moist boards 16*a* as the boards 16*a* are conveyed to the roller pairs. These rollers 28 are adapted to squeeze most of the moisture from both the top and bottom sides of the boards 16*a* while driving the boards 16*a* from the input port 22 along the guide path to the output port 24. The rollers 28 are driven by conventional drive means such as a motor and the driver rollers 30 which are rotatably mounted within the housing 20 in frictional engagement with the rollers 28. At least one pair of narrow vacuum suction ports 32 is fixedly mounted within the housing 20 across the opposite sides of the guide path and near the output port 24 for removing the moisture remaining after the prior squeezing operation from the top and bottom sides of the boards 16*a* before the boards 16*a* are driven through the output port 24. The housing 20 is provided with an outlet 34 for disposing of the moisture squeezed and sucked from the boards 16*a*. This method and apparatus for quickly and thoroughly drying moist boards is relatively quiet when compared to conventional air blasting techniques and eliminates any handling of the boards by an operator during the drying operation. The dryer unit 19 may be used advantageously whenever the boards 16*a* are moistened during one processing operation and must be dried before further processing.

Figure 3:
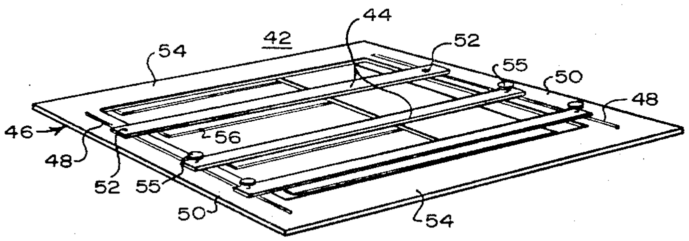
FIGURE 3 is a detailed perspective view of the universal rack of FIGURE 1.
Figure 4:
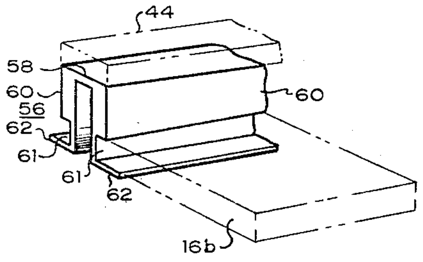
FIGURE 4 is a sectional perspective view of one of the crossbar assemblies of FIGURE 3.

The dried boards 16*b* are conveyed from the drying substation 14 by another conveyor belt 36 and belt drive 38 to a component loading substation 40 where they are further processed and mounted for component loading on a flat universal rack 42 such as the one shown in detail in FIGURES 3 and 4. This universal rack 42 comprises a plurality of crossbars 44 slidably mounted on a rectangular frame 46 made of a rust-resistant material such as stainless steel. The crossbars 44 are made approximately one-eighth of an inch thick and the rectangular frame 46 is made of channel stock approximately three-eighths of an inch thick to provide a very flat universal rack 42 that is both rigid and durable. Slots 48 are formed in the parallel side sections 50 of the rectangular frame 46 for alignment with a pair of holes 52 formed in the opposite ends of each crossbar 44. The crossbars 44 are separated from one another and from the end sections 54 of the rectangular frame 46 by a selected corresponding to the width of the dried boards 16*b* to be mounted and are releasably held in place by conventional lock nuts 55. These lock nuts 55 are mounted through the aligned holes 52 and slots 48 so that when they are turned from the locked position they release the crossbars 44 and so that they can be slid with the crossbars 44 to other crossbar positions and again turned to the locked position to hold the crossbars 44 in place. A number 56 comprising, for example, an extrusion of an acid and heat resistant material such as Teflon is attached to the bottom side of each of the end sections 54 of the rectangular frame 46 and to the bottom side of each of the crossbars 44 for engaging the dried boards 16*b* and holding them in place. As shown in detail in FIGURE 4 each of these members 56 comprises a flat upper portion 58 which may readily be attached to the bottom side of a crossbar 44 or to the bottom side of an end section 54, a pair of side portions 60 each of which includes a notch 61 corresponding to the thickness of a typical board, and a pair of foot portions 62 which extend generally parallel to the upper portion 58 for a sufficient distance to support the boards and, if desired, to cover terminals along the ends of the boards which should not be soldered. This member 56 is thusly adapted for simply engaging the edge of a board 16*b* and is resilient so that the boards 16*b* may be quickly snapped in place and held firmly in position during subsequent processing operations even though the position of the crossbars 44 is only roughly adjusted to accommodate the size of the boards 16*b*. When the dried boards 16*b* are securely mounted in place in the universal rack 42 they may be easily loaded with components during the component loading operation.

The universal racks 42 bearing the loaded boards 16*c* are next placed on a parallel chain conveyor 64 which is driven by the chain conveyor drive 66 and are conveyed to a soldering substation 68 where the components are soldered to the boards 16*c*. This soldering operation may be performed, for example, by passing the loaded boards 16*c* through a wave of solder 70 such as that provided by a conventional wave soldering machine. From the soldering substation 68 the universal racks 42 bearing the loaded and soldered boards 16*d* are conveyed to a washing and drying substation 72. At this washing and drying substation 72 the solder flux is washed from the loaded and soldered boards 16*d* by the operation of spraying them with a cleaning solvent such as water where the flux is water soluble. The washed boards 16*e* are dried by the operations of blowing them with a warm gas such as air and by radiantly heating them. These washing and drying operations may be performed by a washing and drying unit 73 such as that shown schematically in FIGURE 1. This washing and drying unit 73 includes successive washing, blowing, and heating chambers 76, 78, and 80, respectively, and comprises a housing 74 made of a rust-resistant material such as stainless steel. The housing 74 includes outlets 81 for draining water from each of the washing, blowing, and heating chambers 76, 78, and 80. The loaded and soldered boards 16*d* are conveyed through an input port 82 in the housing 74 and into the washing chamber 76. A pliable flap 84, which is attached to the housing 74 at the input port 82, drags across the tops of the loaded and soldered boards 16*d* as they enter the washing chamber 76 to minimize the spillage of water from the input port 82 of the washing chamber. A plurality of pipes 86 each having a plurality of nozzles 88 directed towards the path of the universal rack 42 through the washing chamber 76 are positioned above and below the path of the universal rack 42. These pipes 86 are connected, for example, to a source of water heated to approximately one-hundred and twenty degrees Fahrenheit or to a source of some other type of cleaning solvent which may be used with or without a separate rinsing solution to remove the flux and other contaminants from the loaded and soldered boards 16*d*. A microswitch 90 is positioned adjacent to one side of the parallel chain conveyor 64 near the input port 82 for turning on the water source. As the front end of a universal rack 42 enters the washing chamber 76 it trips the microswitch 90 and turns on the water source so that the loaded and soldered boards 16*d* are sprayed with cleaning solvent from the nozzles 88. The washing chamber 76 is separated from the adjacent blowing chamber 78 by a baffle 92 which minimizes the amount of cleaning solvent spray reaching the blowing chamber 78. A plurality of pipes 94 each having a plurality of nozzles 96 directed towards the path of the universal rack 42 through the blowing chamber 78 are positioned above and below the path of the universal rack 42. These pipes 94 are connected to a source of gas such as air which is heated to a temperature not in excess of one-hundred and thirty-five degrees Fahrenheit. A microswitch 98 is positioned adjacent to one side of the chain conveyor 64 near the baffle 92 for turning on the air source. As the front end of the universal rack 42 enters the blowing chamber 78 it trips the microswitch 98 and turns on the air source so that the washed boards 16*e* are blown with warm air from the nozzles 96 to remove most of the water from the washed boards 16*e*. As the universal rack 42 proceeds through the blowing chamber 78 it also trips another microswitch 100 which is positioned for turning the water source off once the universal rack 42 has left the washing chamber 76. This blowing chamber is separated from the adjacent heating chamber 80 by a baffle 102 which minimizes the amount of moisture that can be blown into the heating chamber 80 from the blowing chamber 78. This heating chamber 80 includes at least one heating element 104 located below the path of the universal rack 42 through the heating chamber 80 for radiantly heating the blown boards 16*f* as they are conveyed through the heating chamber. The heating element 104 is always turned on to maintain an even temperature throughout the heating chamber 80, and the heating chamber 80 is made sufficiently long to provide adequate time for the radiant heat from the heating element 104 to completely dry the blown boards 16*f*. As the universal rack 42 proceeds through the heating chamber 80 it trips a microswitch 106 which is positioned for turning off the air source when the universal rack 42 has left the blowing chamber 78. Upon leaving the heating chamber 80 the heated boards 16*g* are dry and may easily be removed from the universal rack 42 to make them ready for testing and use.

We claim:

1. A method for efficiently processing printed circuit boards which have been moistened during a prior operation in the formation thereof, said method comprising the steps of:
squeezing the printed circuit boards between adjacent rollers to remove some of the moisture therefrom;
sucking the printed circuit boards between adjacent vacuum suction ports to substantially remove the remaining moisture from the printed circuit boards;
mounting the demoisturized printed circuit boards on a universal rack;
loading the mounted printed circuit boards with circuit components;
soldering the circuit components to the mounted printed circuit boards;
spraying the mounted and soldered printed circuit boards with a cleaning solvent to wash them;
blowing the washed printed circuit boards with a warm gas to remove some of the moisture from them; and
radiantly heating the blown printed circuit boards to substantially remove the remaining moisture from them.

2. A method for processing printed circuit boards, said method comprising the successive steps of:
etch-forming the printed circuit boards;
mounting the etch-formed printed circuit boards on a rack;
loading the mounted printed circuit boards with circuit components;
soldering circuit components to the printed circuit boards;
spraying both sides of the soldered printed circuit boards with a cleaning solvent to wash the printed circuit boards;

blowing both sides of the washed printed circuit boards with a warm gas to remove some of the moisture from the printed circuit boards; and radiantly heating the blown printed circuit boards to remove remaining moisture from them.

References Cited

UNITED STATES PATENTS

| | | | |
|---|---|---|---|
| 2,356,411 | 8/1944 | Kuntz ____________ | 15—302 XR |
| 2,621,445 | 12/1952 | Wallace __________ | 15—308 XR |
| 2,656,701 | 10/1953 | Hortenbach ______ | 15—302 XR |
| 3,218,193 | 11/1965 | Isaacson _________ | 228—37 XR |
| 3,211,571 | 10/1965 | Harris et al. ______ | 118—73 XR |
| 3,123,084 | 3/1964 | Tardoskegyi ____ | 134—122 XR |
| 3,338,208 | 8/1967 | Voss ____________ | 118—73 XR |

JOHN F. CAMPBELL, *Primary Examiner.*

ROBERT W. CHURCH, *Assistant Examiner.*

U.S. Cl. X.R.

15—306; 34—17, 78; 134—72; 228—37, 38

UNITED STATES PATENT OFFICE

CERTIFICATE OF CORRECTION

Patent No. 3,421,211 January 14, 1969

Maynard D. Eaves et al.

It is certified that error appears in the above identified patent and that said Letters Patent are hereby corrected as shown below:

Column 2, line 59, after "selected" insert -- distance --. Column 3, line 43, after "are" insert -- then --.

Signed and sealed this 17th day of March 1970.

(SEAL)
Attest:

Edward M. Fletcher, Jr.
Attesting Officer

WILLIAM E. SCHUYLER, JR.
Commissioner of Patents